US006259636B1

(12) United States Patent
Fukuda et al.

(10) Patent No.: US 6,259,636 B1
(45) Date of Patent: Jul. 10, 2001

(54) SEMICONDUCTOR MEMORY DEVICE HAVING REDUNDANCY CIRCUIT FOR RELIEVING FAULTY MEMORY CELLS

(75) Inventors: Ryo Fukuda, Yokohama; Toshimasa Namekawa, Tokyo, both of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/257,505

(22) Filed: Feb. 25, 1999

(30) Foreign Application Priority Data

Feb. 27, 1998 (JP) .................................... 10-046440

(51) Int. Cl.[7] .............................. G11C 29/00; G11C 7/00
(52) U.S. Cl. ................. 365/200; 365/225.7; 365/230.06; 365/230.08; 365/201
(58) Field of Search ................................. 365/200, 225.7, 365/230.06, 230.08, 201

(56) References Cited

U.S. PATENT DOCUMENTS

| 4,051,354 | * | 9/1977 | Choate ................................. 235/312 |
| 4,827,452 | * | 5/1989 | Toyama et al. ...................... 365/200 |
| 5,058,069 |   | 10/1991 | Gaultier et al. ..................... 365/200 |
| 5,577,050 | * | 11/1996 | Bair et al. ........................... 371/10.2 |
| 5,732,029 |   | 3/1998 | Lee et al. ............................. 365/200 |
| 5,732,031 |   | 3/1998 | Morgan ................................ 365/200 |
| 5,798,974 | * | 8/1998 | Yamagata ............................. 365/200 |
| 5,808,948 | * | 9/1998 | Kim et al. ............................ 365/201 |
| 5,917,764 | * | 6/1999 | Ohsawa et al. ...................... 365/200 |
| 5,953,267 | * | 9/1999 | Oh ....................................... 365/200 |

OTHER PUBLICATIONS

Tomoaki Yabe et al.; "A Configurable DRAM Macro Design for 2112 Derivative Organizations to be Synthesized Using a Memory Generator"; IEEE Journal of Solid–State Circuits, vol. 33, No. 11; Nov. 1998; pp. 1752–1757.

* cited by examiner

*Primary Examiner*—David Nelms
*Assistant Examiner*—Connie C. Yoha
(74) *Attorney, Agent, or Firm*—Banner & Witcoff, Ltd.

(57) ABSTRACT

In a semiconductor memory device having a redundant cell array, a replacement control circuit stores in advance a faulty address in an address space assigned to the memory cell array and information for specifying the dimension of the faulty address, compares each of external addresses XA and YA with the stored faulty address, and detects their coincidence. When the external address coincides with the faulty address, a redundant row or a redundant column constituting the redundant cell array is selected and replaced with the faulty cell, on the basis of the information representing the dimension of the faulty address. By this operation, the faulty cell on the memory cell array can be flexibly relieved, and the flexibility of redundancy can be improved.

18 Claims, 7 Drawing Sheets

SEMICONDUCTOR MEMORY DEVICE HAVING REDUNDANCY CIRCUIT FOR RELIEVING FAULTY MEMORY CELLS

BACKGROUND OF THE INVENTION

This invention relates to a semiconductor memory device, and particularly to a semiconductor memory device comprising a redundancy circuit for relieving faulty memory cell on a memory cell array.

Recently, further miniaturization of a memory cell has been promoted together with increase in a large capacity of a memory such as a dynamic RAM. If a memory cell is miniaturized, various faults easily occur. For this reason, it is difficult to normally operate a memory cell of the total bits and the yield of the good products is decreased. Thus, in general, a redundancy circuit for relieving a faulty memory cell is provided in a memory of a large capacity.

FIG. 7 illustrates an example of a schematic structure of a conventional semiconductor memory device comprising a redundancy circuit. A memory cell array 1 is constituted by aligning normal memory cells of predetermined capacity in a matrix of rows and columns. A redundant row 2 and a redundant column 3 are constituted by aligning redundant memory cells for relieving faulty cells that exist in the memory cell array 1. A two-dimensional address space represented by an n-bit row address XA and an n-bit column address YA, both from the outside, is assigned to the memory cell array 1.

In this example, each of the external row address XA and the external column address YA has a bit length of n bits, however the lengths of the addresses are determined in accordance with the capacity of the memory cell array 1. The redundant row 2, which relieves the row address XA from the fault, is constituted by one or a predetermined number of rows. The redundant column 3, which relieves the column address YA from the fault, is also constituted by one or a predetermined number of columns.

A row decoding circuit 4 decodes the row address XA and selects the rows of the memory cell array 1, and is constituted to drive X-address selection lines (word lines) 10 on the basis of the row address XA. A column decoding circuit 5 decodes the column address YA and selects the columns of the memory cell array 1, and is constituted to select Y-address selection lines (bit lines) 11 on the basis of the column address YA.

In the normal write or read operations, a normal memory cell 9 located at a point of intersection of the X-address selection line 10 and the Y-address selection line 11 selected respectively by the row decoding circuit 4 and the column decoding circuit 5, and the data read or write is carried out for the memory cell 9.

A redundant row decoding circuit 6 selects the redundant row 2, and is constituted to be activated by a replacement control circuit 8-3 described later and select an X-address selection line 10a of the redundant row 2. A redundant column decoding circuit 7 selects the redundant column 3, and is constituted to be activated by a replacement control circuit 8-4 described later and select a Y-address selection line 11a of the redundant column 3.

When the redundant row 2 is selected by the redundant row decoding circuit 6, a spare memory cell, i.e. a redundant memory cell, 9ax located at a point of intersection of the Y-address selection line 11 selected by the column decoding circuit 5 and the X-address selection line 10a of the redundant row 2 is accessed. When the redundant column 3 is selected by the redundant column decoding circuit 7, a spare memory cell, i.e. a redundant memory cell, 9ay located at a point of intersection of the X-address selection line 10 selected by the row decoding circuit 4 and the Y-address selection line 11a of the redundant column 3 is accessed.

When the external row address XA coincides with a faulty row address stored in advance in the replacement control circuit 8-3, the replacement control circuit 8-3 activates the redundant row decoding circuit 6 by a redundant row activation signal XRE. Similarly, when the external column address YA coincides with a faulty column address stored in advance in the replacement control circuit 8-4, the replacement control circuit 8-4 activates the redundant column decoding circuit 7 by a redundant column activation signal YRE. The replacement control circuit 8-3 is operated independently of the column address YA, and the replacement control circuit 8-4 is operated independently of the row address XA.

The redundant row activation signal XRE from the replacement control circuit 8-3 is inverted by an inverter 30 and supplied to the row decoding circuit 4 so that the row decoding circuit 4 can be deactivated when the redundant row activation signal XRE is activated. The redundant column activation signal YRE from the replacement control circuit 8-4 is inverted by an inverter 31 and supplied to the column decoding circuit 5 so that the column decoding circuit 5 can be deactivated when the redundant column activation signal YRE is activated.

FIG. 8 illustrates an example of the structure of the replacement control circuits 8-3 and 8-4. A memory circuit 14 stores selection information about use or non use of the redundancy circuit, and the faulty addresses, and comprises fuse circuits FE and F(0) to F(n−1) for respectively storing the selection information and the faulty addresses. Each of the fuse circuits is constituted by using, for example, a fuse, so as to store 1-bit data in response to the blown or non-blown state of the fuse. The fuse circuit FE stores the selection information of the redundancy circuit, and the fuse circuits F(0) to F(n−1) store the respective bit data of the faulty addresses.

An address coincidence detecting circuit 16 compares the respective bit data of the faulty addresses stored in the fuse circuits F(0) to F(n−1) with respective bit data Add(0) to Add(n−1) of external addresses, and activates and outputs a coincidence detection signal MATCH when the bit data coincide with one another. An AND circuit 17 operates a logic product of the selection information stored in the memory circuit 14 and the coincidence detection signal MATCH from the address coincidence detecting circuit 16, and outputs an activation signal RE. That is, this replacement control circuit activates and outputs the activation signal RE when the faulty address coincides with the external address.

When the replacement control circuit shown in FIG. 8 is used as the replacement control circuit 8-3 in FIG. 7, the information to select the use or non-use of the redundant row 2 is stored in the fuse circuit FE and the activation signal RE is taken as the redundant row activation signal XRE. When the replacement control circuit shown in FIG. 8 is used as the replacement control circuit 8-4 in FIG. 7, the information to select the use or non-use of the redundant column 3 is stored in the fuse circuit FE and the activation signal RE is taken as the redundant column activation signal YRE.

For example, when the fault is relieved by using the redundant row 2, "1" is written and stored as the selection information in the fuse circuit FE constituting the replacement control circuit 8-3. Further, the respective bit data of the faulty row address is written in the fuse circuits F(0) to F(n−1). It is judged which of the redundant row 2 and the redundant column 3 should be used, in accordance with the generation scheme of the faulty cell (fault mode), and the desired data is stored in the replacement control circuit 8-3 or 8-4.

In this case, the fuse circuit FE shown in FIG. 8 serving as the replacement control circuit 8-3 outputs logic value "1". The fuse circuits F(0) to F(n−1) output the respective bit data of the faulty row address as their output signals FOUT(0) to FOUT(n−1). The address coincidence detecting circuit 16 compares the bit data Add(0) to Add(n−1) of the row address from the outside with the bit data of the faulty address from the fuse circuits F(0) to F(n−1), and activates the coincidence detection signal MATCH and outputs logic value "1" when the bit data coincide with one another. The AND circuit 17 activates the activation signal RE and outputs logic value "1" when both the output signal from the fuse circuit FE and the output signal from the address coincidence detecting circuit 16 become logic value "1".

That is, "1" is written in the replacement control circuit 8-3 as the selection information for selection of use or non-use of the redundant row 2, and the replacement control circuit 8-3 activates the redundant row activation signal XRE when the row address from the outside coincides with the faulty row address. If the selection information stored in the replacement control circuit 8-3 is assumed to be "0" (unwritten state), the redundant row activation signal XRE is fixed to be in the deactivated state.

The overall operations of the redundancy circuit provided in the conventional semiconductor memory device will be explained below with reference to FIG. 7, while exemplifying a case where the information to relieve the fault by using the redundant row 2 is written in the replacement control circuit 8-3 as described above.

The row address signal XA from the outside is input to both the row decoding circuit 4 and the replacement control circuit 8-3. The replacement control circuit 8-3 compares the row address XA with the faulty row address, and activates the redundant row activation signal XRE when both addresses coincide with one another. When the redundant row activation signal XRE is activated, the redundant row decoding circuit 6 inputting the redundant row activation signal XRE is activated and the row decoding circuit 4 receiving an inverted signal of the redundant row activation signal XRE is deactivated. Thus, the redundant row 2 is selected and all the X address selection lines (word lines) of the memory cell array 1 are set in the non-selected state. As a result, the normal row of the memory cell array 1 selected by the faulty row address is replaced with the redundant row 2 and the faulty cell is relieved.

When the redundant column 3 is used, desired information (information for selection of use or non-use of the redundant column 3 and the faulty column address) may be written in the replacement control circuit 8-4. Thus, when the external column address coincides with the faulty column address, the normal column of the memory cell array 1 selected by the faulty column address is replaced with the redundant column 3.

Incidentally, in the above-described conventional semiconductor memory device, desired information is written in the only replacement control circuit 8-3 when the redundant row 2 is used or the only replacement control circuit 8-4 when the redundant column 3 is used. In other words, the memory circuit 14 of the replacement control circuit 8-3 can be used only when the redundant row 2 is used, while the memory circuit 14 of the replacement control circuit 8-4 can be used only when the redundant column 3 is used. For this reason, if each of the replacement control circuits is noticed, the apparatus cannot respond flexibly to the relief of fault and lacks flexibility in redundancy.

BRIEF SUMMARY OF THE INVENTION

The present invention is accomplished in consideration of the above-mentioned circumstances, and its object is to provide a semiconductor memory device wherein replacement control circuits for storing a faulty address can flexibly respond to the fault in each dimension in an address space and thereby the flexibility of redundancy can be improved.

According to a first aspect of the present invention, there is provided a semiconductor memory device which comprises: a memory cell array in which memory cells are aligned in a matrix and to which a two-dimensional address space is assigned; a redundant row for relieving a faulty cell existing in the memory cell array; a redundant column for relieving the faulty cell existing in the memory cell array; a row decoding circuit for decoding an external address and selecting a row of the memory cell array; a column decoding circuit for decoding the external address and selecting a column of the memory cell array; a redundant row decoder circuit; a redundant column decoder circuit; and a replacement control circuit for storing a faulty address of one of the row and the column of the memory cell array, and detecting coincidence between the faulty address and the external address to output a replacement control signal indicative of replacing the faulty cell with the one of redundant row and the redundant column. With the semiconductor memory device according to the first aspect of the present invention, the redundant row or the redundant column is selected in accordance with the faulty address stored in the replacement control circuit. Therefore, it is possible to flexibly respond to the fault in the row and the column and thereby improve the flexibility of redundancy.

In the semiconductor memory device according to the first aspect of the present invention, when the row of the memory cell array is faulty, the replacement control circuit may output the replace control signal to the redundant row decoder circuit, and the redundant row decoder circuit may select the redundant row in accordance with the replacement control signal. When the redundant row is selected by the redundant row decoder circuit, the row decoding circuit may receive an inverted signal of the replacement control signal and may be disabled.

In the semiconductor memory device according to the first aspect of the present invention, when the column of the memory cell array is faulty, the replacement control circuit may output the replace control signal to the redundant column decoder circuit, and the redundant column decoder circuit may select the redundant column in accordance with the replacement control signal. When the redundant column is selected by the redundant column decoder circuit, the column decoding circuit may receive an inverted signal of the replacement control signal and may be disabled.

In the semiconductor memory device according to the first aspect of the present invention, the replacement control circuit may comprise: a first memory unit for storing one of a row address and a column address as the faulty address; a second memory unit for storing information to identify the faulty address stored in the first memory unit as the row address or the column address; a row address coincidence detecting circuit for detecting coincidence between a row address of the external address and the faulty address stored in the first memory unit; a column address coincidence detecting circuit for detecting coincidence between a column address of the external address and the faulty address stored in the first memory unit; and a gate circuit for validating results of detection of one of the row address coincidence detecting circuit and the column address coincidence detecting circuit on the basis of the information stored in the second memory unit. With this structure, the faulty address stored in the first memory unit is defined as either the row address or the column address. When the external address coincides with the faulty address stored in the first memory unit, either the redundant row or the redundant column is selected in accordance with the row address or the column address which is the faulty address. Part of the first memory unit may serve as part of the memory unit in accordance with difference in bit number between the row address and the column address stored as the faulty address. For example, when the number of bits in the row address is larger than that in the column address and the column address is stored in the first memory unit as the faulty address, a part of the first memory unit is left. In this case, information for specifying that the faulty address is the column address is stored in a part of the left first memory unit. Similarly, when the number of bits in the column address is larger than that in the row address, information for specifying that the faulty address is the row address is stored in a part of the left first memory unit. Thus, the second memory unit does not need to be provided independently and, therefore, the circuitry magnitude of the second memory unit can be restricted. Each of the first memory unit and the second memory unit may comprise a plurality of data storing circuits. Each of data storing circuits may comprise a resistor and a fuse connected in series between a high potential and a low potential.

Further, according to a second aspect of the present invention, there is provided a semiconductor memory device which comprises: a memory cell array in which memory cells are aligned in a matrix and to which a two-dimensional address space is assigned; a plurality of redundant rows for relieving a faulty cell existing in the memory cell array; a plurality of redundant columns for relieving the faulty cell existing in the memory cell array; a row decoding circuit for decoding an external address and selecting a row of the memory cell array; a column decoding circuit for decoding the external address and selecting a column of the memory cell array; and a plurality of redundant row decoder circuits; a plurality of redundant column decoder circuits; and a plurality of replacement control circuits each for storing a faulty address of one of a corresponding row and a corresponding column of the memory cell array, and detecting coincidence between the faulty address and the external address to output a replacement control signal indicative of replacing the faulty cell with the one of the corresponding redundant row and the corresponding redundant column. With the semiconductor memory device according to the second aspect of the present invention, it is possible to respond to a plurality of fault modes and thereby improve the rate of relief of the fault.

In the semiconductor memory device according to the second aspect of the present invention, when the row of the memory cell array is faulty, the each replacement control circuit may output the replace control signal to a corresponding redundant row decoder circuit, and the corresponding redundant row decoder circuit may select the corresponding redundant row in accordance with the replacement control signal. When the corresponding redundant row is selected by the corresponding redundant row decoder circuit, a corresponding row decoding circuit may receive an inverted signal of the replacement control signal and may be disabled.

In the semiconductor memory device according to the second aspect of the present invention, when the column of the memory cell array is faulty, the each replacement control circuit may output the replace control signal to a corresponding redundant column decoder circuit, and the corresponding redundant column decoder circuit may select the corresponding redundant column in accordance with the replacement control signal. When the corresponding redundant column is selected by the corresponding redundant column decoder circuit, a corresponding column decoding circuit may receive an inverted signal of the replacement control signal and may be disabled.

In the semiconductor memory device according to the second aspect of the present invention, each of the replacement control circuit may comprise: a first memory unit for storing a row address or a column address as the faulty address; a second memory unit for storing information to identify the faulty address stored in the first memory unit as the row address or the column address; a row address coincidence detecting circuit for detecting coincidence between a row address of the external address and the faulty address stored in the first memory unit; a column address coincidence detecting circuit for detecting coincidence between a column address of the external address and the faulty address stored in the first memory unit; and a gate circuit for validating results of detection of one of the row address coincidence detecting circuit and the column address coincidence detecting circuit on the basis of the information stored in the second memory unit. With this structure, the faulty address stored in the first memory unit is defined as either the row address or the column address. When the external address coincides with the faulty address stored in the first memory unit, either the redundant row or the redundant column is selected in accordance with the row address or the column address which is the faulty address. Part of the first memory unit may serve as part of the memory unit in accordance with difference in bit number between the row address and the column address stored as the faulty address. For example, when the number of bits in the row address is larger than that in the column address and the column address is stored in the first memory unit as the faulty address, a part of the first memory unit is left. In this case, information for specifying that the faulty address is the column address is stored in a part of the left first memory unit. Similarly, when the number of bits in the column address is larger than that in the row address, information for specifying that the faulty address is the row address is stored in a part of the left first memory unit. Thus, the second memory unit does not need to be provided independently and, therefore, the circuitry magnitude of the second memory unit can be restricted. Each of the first memory unit and the second memory unit may comprise a plurality of data storing circuits. Each of data storing circuits may comprise a resistor and a fuse connected in series between a high potential and a low potential.

The faulty address stored in the memory circuit according to the present invention may be one-dimensional or two-dimensional, i.e. may not be particularly limited. For example, when the address space assigned to the memory cell array is in three dimensions of x, y and z, the faulty address may be in one dimension of x or in two dimensions of y and z. In this case, the dimensions represented by the information which is stored in the second memory unit may be determined in accordance with the dimensions of the faulty address stored in the first memory unit.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 7:
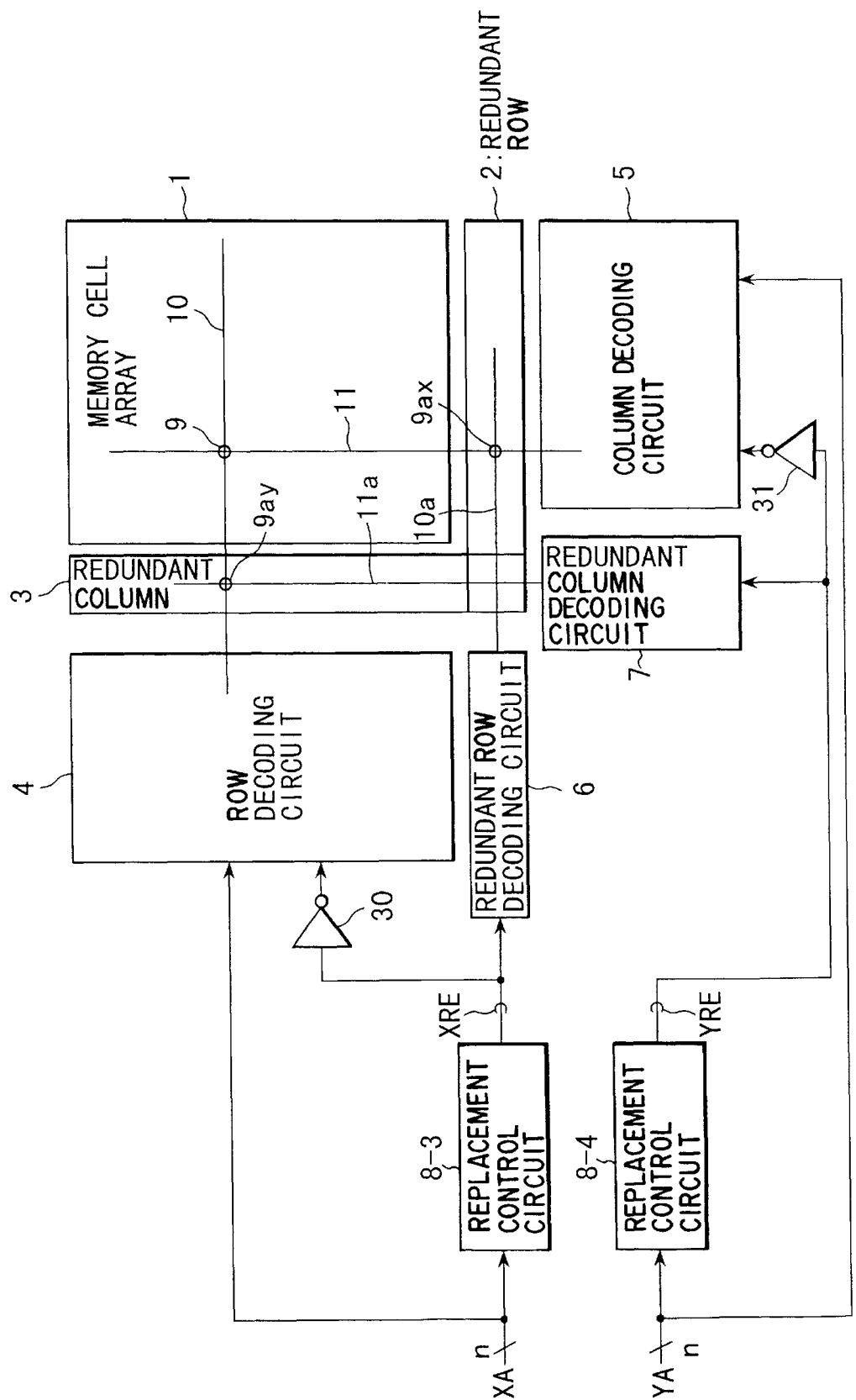
FIG. 7 is a block diagram illustrating a schematic structure of a conventional semiconductor memory device.
Figure 8:
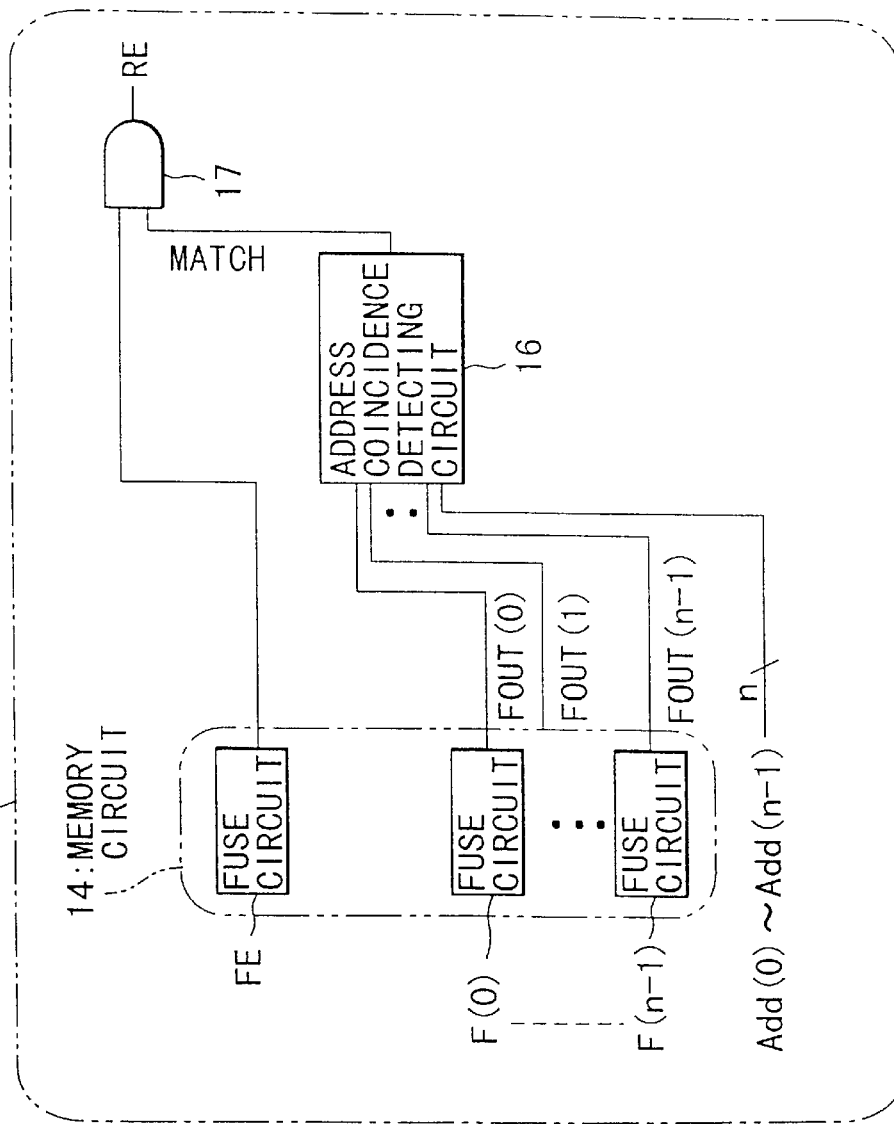
FIG. 8 is a view illustrating an example of a structure of a replacement control circuit which the conventional semiconductor memory device comprises.

The embodiments of the present invention will be explained below with reference to the figures, by exemplifying a semiconductor memory device having memory cell array to which a two-dimensional address space of an X-Y matrix is assigned. In each of the figures, the same elements as those shown in above-described FIGS. 7 and 8 are denoted by the same reference numerals for simplicity.

First Embodiment

Figure 1:
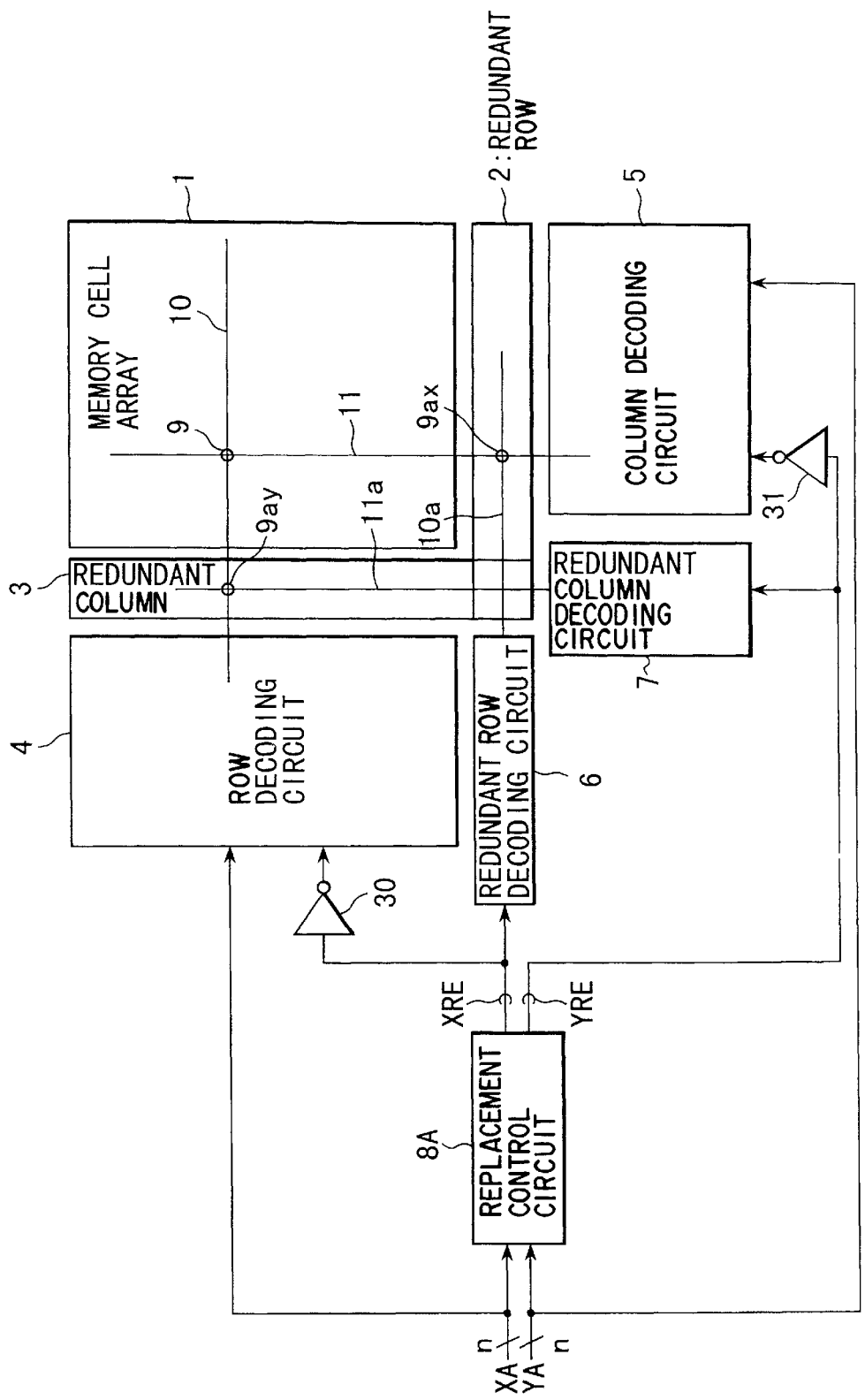
FIG. 1 is a block diagram illustrating a schematic structure of a semiconductor memory device according to a first embodiment of the present invention.

FIG. 1 illustrates a schematic structure of a semiconductor memory device according to a first embodiment of the present invention. This semiconductor memory device comprises a replacement control circuit 8A as a replacement control circuit serving as a characterizing part of the present invention, instead of the replacement control circuits 8-3 and 8-4 in the semiconductor memory device shown in FIG. 7 of the above-described prior art.

In the semiconductor memory device shown in FIG. 1, a memory cell array 1 is constituted by aligning normal memory cells of predetermined capacity in a matrix of rows and columns. A redundant row 2 and a redundant column 3 are constituted by aligning redundant memory cells for relieving faulty cells that exist in the memory cell array 1. A two-dimensional address space represented by an n-bit row address XA and an n-bit column address YA, both from the outside, is assigned to the memory cell array 1.

In the embodiment, each of the external row address XA and the external column address YA has a bit length of n bits, however the lengths of the addresses are determined in accordance with the capacity of the memory cell array 1. The redundant row 2 relieves the row address XA from the fault, and the redundant column 3 relieves the column address YA from the fault.

A row decoding circuit 4 decodes the row address XA and selects the rows of the memory cell array 1, and is constituted to drive X-address selection lines (word lines) 10 on the basis of the row address XA. A column decoding circuit 5 decodes the column address YA and selects the columns of the memory cell array 1, and is constituted to select Y-address selection lines (bit lines) 11 on the basis of the column address YA.

In the normal write or read operations, a normal memory cell 9 located at a point of intersection of the X-address selection line 10 and the Y-address selection line 11 selected respectively by the row decoding circuit 4 and the column decoding circuit 5, and the data read or write is carried out for the memory cell 9.

The replacement control circuit 8A activates one of the redundant row detecting circuit 6 and the redundant column detecting circuit 7, the details of the replacement control circuit 8A being described later. When the redundant row detecting circuit 6 is activated, the redundant row detecting circuit 6 selects an X-address selection line 10a of the redundant row 2, and on the other hand when the redundant column detecting circuit 7 is activated, the redundant column detecting circuit 7 selects an Y-address selection line 11a of the redundant column 3.

When the redundant row 2 is selected by the redundant row decoding circuit 6, a spare memory cell, i.e. a redundant memory cell, 9ax located at a point of intersection of the Y-address selection line 11 selected by the column decoding circuit 5 and the X-address selection line 10a of the redundant row 2 is accessed. When the redundant column 3 is selected by the redundant column decoding circuit 7, a spare memory cell, i.e. a redundant memory cell, 9ay located at a point of intersection of the X-address selection line 10 selected by the row decoding circuit 4 and the Y-address selection line 11a of the redundant column 3 is accessed.

Figure 2:
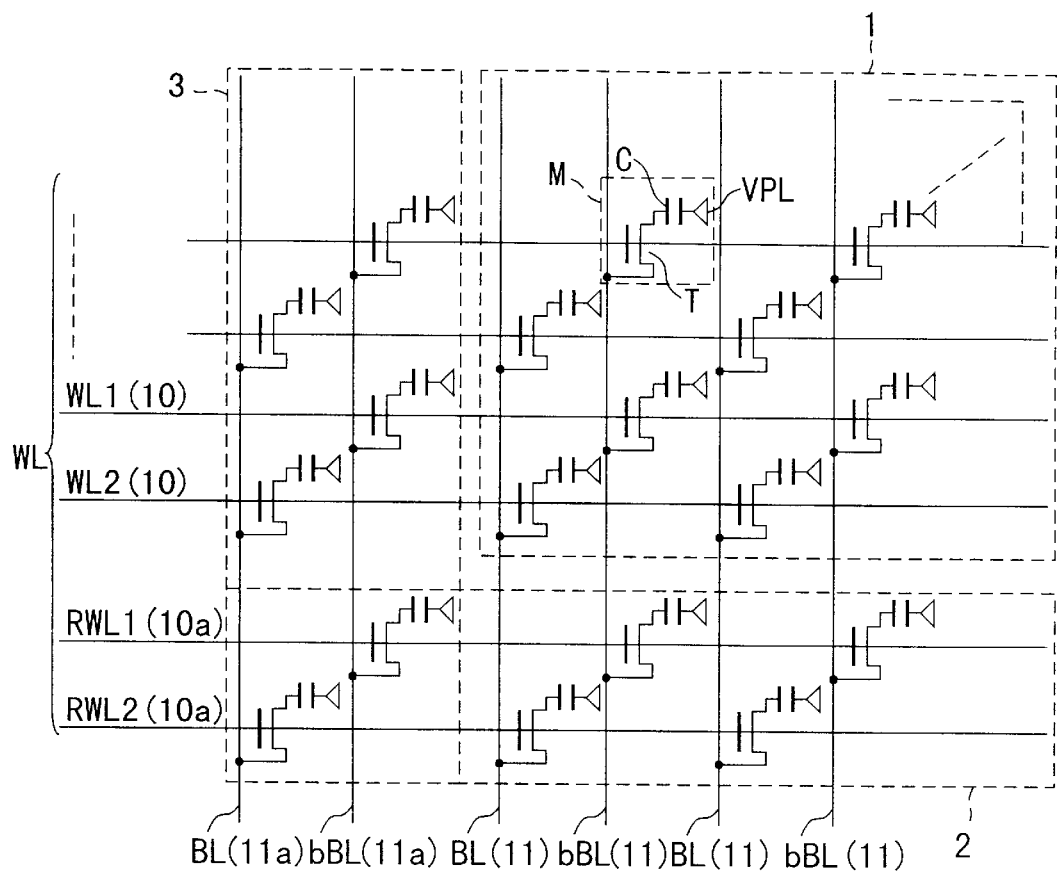
FIG. 2 is a view illustrating an example of a structure of a memory cell array which the semiconductor memory device according to the first embodiment of the present invention comprises.

FIG. 2 illustrates an example of constitution of a redundant row 2, a redundant column 3 and a memory cell array 1 in a case where the memory device is a DRAM (dynamic random access memory). A word line WL to be selected on the basis of a row address, and bit pairs BL and bBL to be selected on the basis of a column address, are provided in the row and column directions, respectively. Memory cells M are arranged at predetermined positions where the word line and the bit lines cross. When a pair of bit lines BL and bBL are noticed, only one memory cell M connected to either the bit line BL or the bit line bBL is selected by one word line. The memory cell M comprises a cell transistor T and a cell capacitor C, and an end of the cell capacitor C is connected to a plate electrode VPL.

The redundant row 2 is constituted by, for example, a unit of two redundant word lines RWL1 and RWL2, and the redundant column 3 is constituted by a unit of two redundant bit lines BL and bBL. The redundant row 2 and the redundant column 3 have the same structures as the normal rows and columns of the memory cell array 1, respectively. In the example shown in FIG. 2, one redundant row corresponding to two word lines is shown, and also one redundant column corresponding to two bit lines is shown. However, the redundant row and the redundant column may be defined in size (such as the number of word lines and the number of bit lines) as occasion requires. Each of bit line pairs BL and bBL is connected to a sense amplifier (not shown) and other circuits.

The X address selection liens 10 and 10a, and the Y address selection lines 11 and 11a in FIG. 1 are imaginary lines to specify the position of the memory cell on the memory cell array 1. On the actual memory cell array, the word lines and the bit lines are arranged as shown in FIG. 2.

Figure 3:
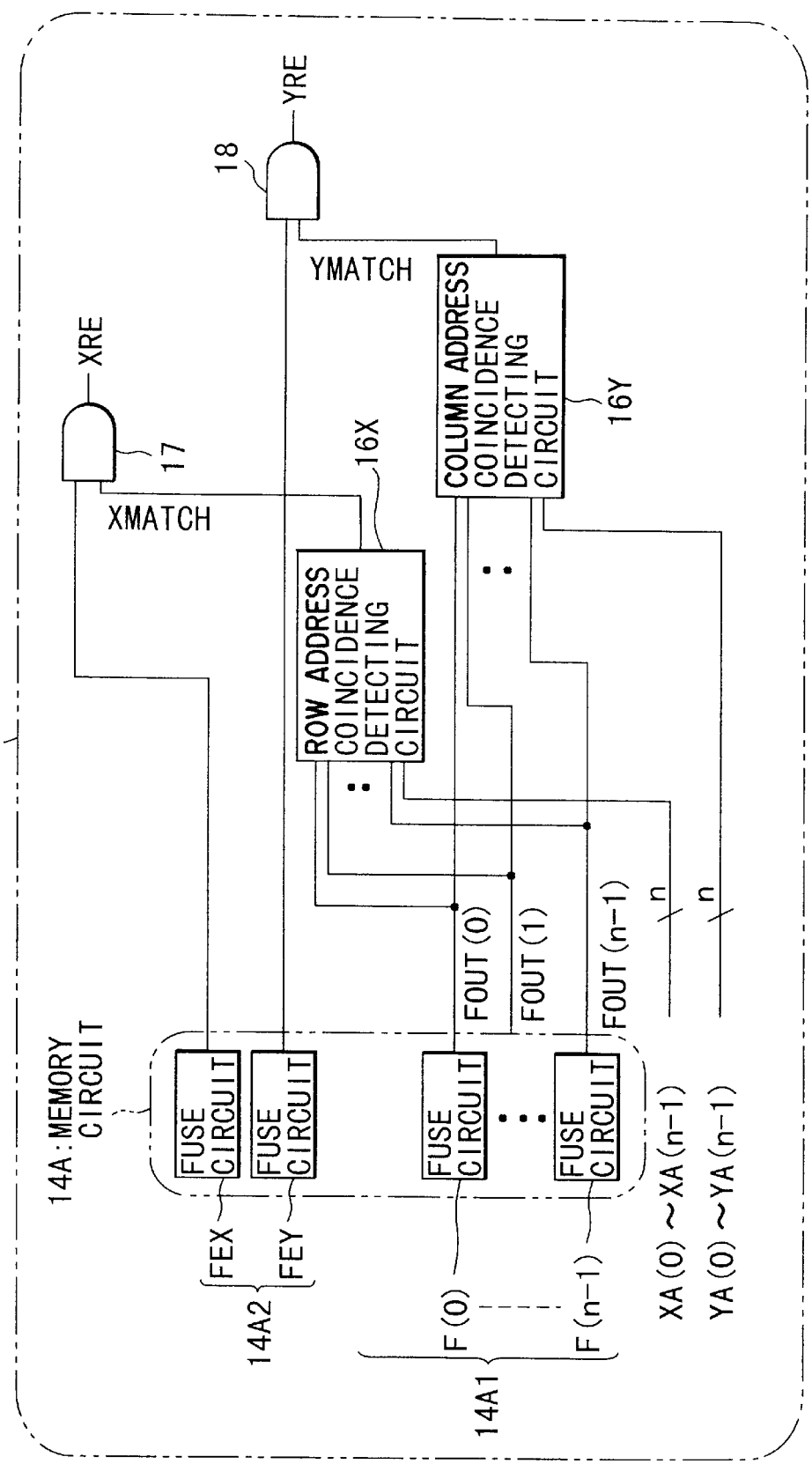
FIG. 3 is a view illustrating an example of a structure of a replacement control circuit which the semiconductor memory device according to the first embodiment of the present invention comprises.

An example of the structure of the replacement control circuit 8A is shown in FIG. 3. The replacement control circuit 8A is constituted to detect coincidence of the external address (i.e. the row address or the column address) to the faulty address, and select the redundant row 2 or the redundant column 3 on the basis of the information for specifying the faulty address as the row address or the column address, i.e. the information representing the dimension of the faulty address in the address space (hereinafter referred to as "dimension information"). Specifically, the replacement control circuit 8A comprises a memory circuit 14A for storing the faulty address and its dimension information. The replacement control circuit 8A activates one of the redundant row activation signal XRE and the redundant column activation signal YRE on the basis of the information stored in the memory circuit 14A. When the replacement control circuit 8A activates the redundant row activation signal XRE, the redundant row 2 is selected. On the other hand, when the replacement control circuit 8A activates the redundant column activation signal YRE, the redundant column 3 is selected.

The memory circuit 14A comprises fuse circuits F(0) to F(n−1) constituted as a first memory unit 14A1 for storing the faulty row address or column address (faulty address), a fuse circuit FEX for storing the dimension information (hereinafter referred to as "row dimension information") to specify whether the faulty address stored in the fuse circuits F(0) to F(n−1) is the row address, and a fuse circuit FEY for storing the dimension information (hereinafter referred to as "column dimension information") to specify whether the faulty address stored in the fuse circuits F(0) to F(n−1) is the column address. The fuse circuits FEX and FEY constitute a second memory unit 14A2 for storing the dimension information to specify whether the faulty address is the row address or the column address.

The replacement control circuit 8A comprises, in addition to the memory circuit 14A, a row address coincidence detecting circuit 16X for comparing the faulty address stored in the memory circuit 14A with the row address XA from the outside so as to activate a row coincidence detection circuit XMATCH, a column address coincidence detecting circuit 16Y for comparing the faulty address stored in the memory circuit 14A with the column address YA from the outside so as to activate a column coincidence detection circuit YMATCH, an AND circuit 17 for operating a logic product between the row dimension information stored in the memory circuit 14A and the row coincidence detection signal XMATCH from the row address coincidence detecting circuit 16X so as to output the redundant row activation signal XRE, and an AND circuit 18 for operating a logic product between the column dimension information stored in the memory circuit 14A and the column coincidence detection signal YMATCH from the column address coincidence detecting circuit 16Y so as to output the redundant row activation signal YRE. The AND circuits 17 and 18 constitute a gate circuit for validating a coincidence detection result from either the row address coincidence detecting circuit 16X or the column address coincidence detecting circuit 16Y, on the basis of the dimension information stored in the memory circuit 14A.

Thus, in the first Embodiment, the set of fuse circuits F(0) to F(n−1) constituting the memory circuit 14A are shared for relief of row and column faults as a memory unit for storing the faulty row address or a memory unit for storing the faulty column address.

Figure 4A:
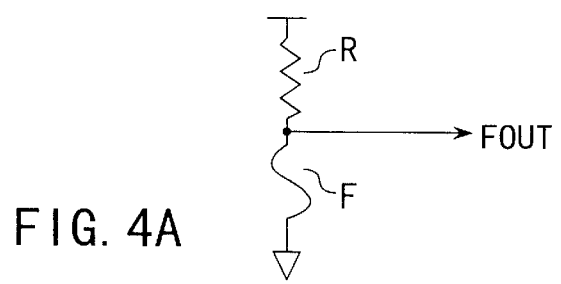
FIG. 4A is a view illustrating an example of a structure of a fuse circuit which the replacement control circuit according to the first embodiment of the present invention comprises.

FIG. 4A shows an example of the structure of the fuse circuits FEX, FEY, and F(0) to F(n−1). In the fuse circuit shown in the figure, a resistor R and a fuse F are serially connected between the power source and the ground, and the 1-bit data is stored in response to the blown/non-blown state of the fuse F. According to the fuse circuit, when the fuse F is in the non-blown state, a junction point between the resistor R and the fuse F is shortened at a ground potential via the fuse F and then logic value "0" is output as the output signal FOUT. On the other hand, when the fuse F is in the blown state, the power source potential appears via the resistor R at the junction point between the resistor R and the fuse F and then logic value "1" is output as the output signal FOUT. The fuse circuits are not limited to this structure and may be constituted by using the EEPROM (Electrically Erasable PROM), the FRAM (Ferroelectric RAM) and the like.

Figure 4B:
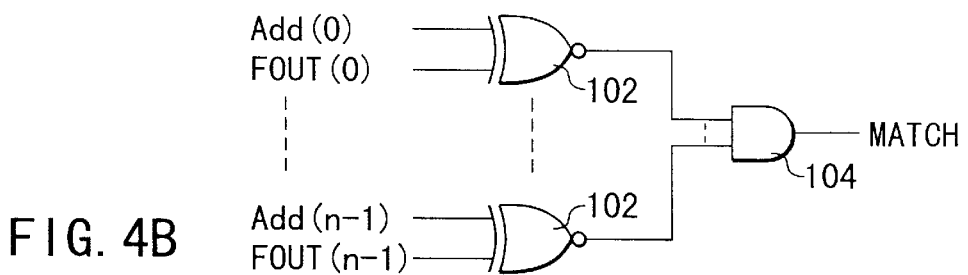
FIG. 4B is a view illustrating an example of a structure of an address coincidence detecting circuit which the replacement control circuit according to the first embodiment of the present invention comprises.

FIG. 4B shows an example of the structure of the row address coincidence detecting circuit 16X and the column address coincidence detecting circuit 16Y. As shown in the figure, the address coincidence detecting circuit comprises a plurality of exclusive-NOR gates 102 for receiving the bit data Add(0) to Add(n−1) of the external address and the bit data FOUT(0) to FOUT(n−1) of the faulty address and outputting logic value "1" when the bit data coincide with one another, and the AND circuit 104 for operating the logic product of the output values of the exclusive-NOR gates and outputting the coincidence detection signal MATCH. The address coincidence detecting circuit activates the coincidence detection signal MATCH when the external address coincides with the faulty address. When the circuit shown in FIG. 4B is used as the row address coincidence detecting circuit 16X shown in FIG. 3, the bit data Add(0) to Add(n−1) are used as the row address XA, and the coincidence detection signal MATCH is used as the row coincidence detection signal XMATCH, in FIG. 4B. When the circuit shown in FIG. 4B is used as the column address coincidence detecting circuit 16Y shown in FIG. 3, the bit data Add(0) to Add(n−1) are used as the column address YA, and the coincidence detection signal MATCH is used as the column coincidence detection signal YMATCH.

The operations of the redundancy circuit of the semiconductor memory device according to the first Embodiment of the present invention, particularly the operations of the replacement control circuit 8A shown in FIG. 3, which serves as a characteristic unit of this semiconductor memory device, will be explained below.

For example, when the fault is relieved by using the redundant row 2 shown in FIG. 1, the bit data of the faulty row address are written in the replacement control circuits F(0) to F(n−1) of the replacement control circuit 8A, and logic value "1" is written and stored in the fuse circuit FEX as the row dimension information. The column dimension information of the fuse circuit FEY remains "0" (non-written state).

The row address coincidence detecting circuit 16X compares the external row address XA with the faulty address stored in the fuse circuits F(0) to F(n−1), and activates the row coincidence detection signal XMATCH when the addresses coincide with one another. Simultaneously with the operation of the row address coincidence detecting circuit 16X, the column address coincidence detecting circuit 16Y compares the external column address YA with the faulty address stored in the fuse circuits F(0) to F(n−1), and activates the column coincidence detection signal YMATCH when the addresses coincide with one another.

The AND circuit 17 receives logic value "1" from the fuse circuit FEX, and activates the redundant row activation signal XRE in accordance with the row coincidence detection signal XMATCH from the row address coincidence detecting circuit 16X. The redundant row decoding circuit 6 shown in FIG. 1, which receives the redundant row activation signal XRE, is activated to select the redundant row 2 when the row address from the outside coincides with the faulty row address. In other words, when the row address coincidence detecting circuit 16X detects the coincidence, the redundant row activation signal XRE is activated in accordance with the row dimension information stored in the fuse circuit FEX and the redundant row 2 is thereby selected. At this time, the row decoding circuit 4 is controlled by the reverse signal of the redundant row activation signal XRE to be set in the deactivated state, and all the word lines of the memory ell array 1 are forced to be in the non-selected state. As a result, the row (faulty cell) of the memory cell array 1 in which the faulty row address is selected is replaced with the redundant row 2.

On the other hand, as the AND circuit 18 in the replacement control circuit 8A receives logic value "0" from the fuse circuit FEY, the redundant column activation signal YRE is fixed in the deactivated state. Thus, the redundant column decoding circuit 7 shown in FIG. 1, which receives the redundant column activation signal YRE, is deactivated, and the redundant column 3 is fixed in the non-selected state. At this time, the column decoding circuit 5 which receives the reverse signal of the redundant column activation signal YRE becomes activated to carry out normal operations and select the column of the memory cell array 1 on the basis of the external column address YA.

In the above explanation of the operations, the redundant row 2 is used. When the redundant column 3 is used, however, logic value "1" is stored in the fuse circuit FEY as the column dimension information and the bit data of the faulty column address is stored in the fuse circuits F(0) to F(n−1). The row dimension information of the fuse circuit FEX remains "0" (non-written state). In this case, the redundant column activation signal YRE is activated in accordance with the column coincidence signal YMATCH. As a result, when the column address from the outside coincides with the faulty address, the redundant column 3 is selected and the column decoding circuit 5 is set in the non-selected state so that the column (faulty cell) of the memory cell array 1 specified by the faulty column address is replaced with the redundant column 3.

Specifically, when the fault is relieved by using the redundant column 3 shown in FIG. 1, the bit data of the faulty column address are written in the replacement control circuits F(0) to F(n−1) of the replacement control circuit 8A, and logic value "1" is written and stored in the fuse circuit FEY as the column dimension information. The row dimension information of the fuse circuit FEX remains "0" (non-written state).

The column address coincidence detecting circuit 16Y compares the external column address YA with the faulty address stored in the fuse circuits F(0) to F(n−1), and activates the column coincidence detection signal YMATCH when the addresses coincide with one another. Simultaneously with the operation of the column address coincidence detecting circuit 16Y, the row address coincidence detecting circuit 16X compares the external row address XA with the faulty address stored in the fuse circuits F(0) to F(n−1), and activates the row coincidence detection signal XMATCH when the addresses coincide with one another.

The AND circuit 18 receives logic value "1" from the fuse circuit FEY, and activates the redundant column activation signal YRE in accordance with the column coincidence detection signal YMATCH from the column address coincidence detecting circuit 16Y. The redundant column decoding circuit 7 shown in FIG. 1, which receives the redundant column activation signal YRE, is activated to select the redundant column 3 when the column address from the outside coincides with the faulty column address. In other words, when the column address coincidence detecting circuit 16Y detects the coincidence, the redundant column activation signal YRE is activated in accordance with the column dimension information stored in the fuse circuit FEY and the redundant column 3 is thereby selected. At this time, the column decoding circuit 5 is controlled by the reverse signal of the redundant column activation signal YRE to be set in the deactivated state, and all the bit lines of the memory ell array 1 are forced to be in the non-selected state. As a result, the column (faulty cell) of the memory cell array 1 in which the faulty column address is selected is replaced with the redundant column 3.

On the other hand, as the AND circuit 17 in the replacement control circuit 8A receives logic value "0" from the fuse circuit FEX, the redundant row activation signal XRE is fixed in the deactivated state. Thus, the redundant row decoding circuit 6 shown in FIG. 1, which receives the redundant row activation signal XRE, is deactivated, and the redundant row 2 is fixed in the non-selected state. At this time, the row decoding circuit 4 which receives the reverse signal of the redundant row activation signal XRE becomes activated to carry out normal operations and select the row of the memory cell array 1 on the basis of the external row address XA.

As explained above, according to the first Embodiment, the results of detection of the row address coincidence detecting circuit 16X and the column address coincidence detecting circuit 16Y are validated or invalidated by the row dimension information and the column dimension information stored respectively in the fuse circuits FEX and FEY. In other words, whether the faulty address stored in the memory unit 14A is the row address or the column address depends on the row dimension information and the column dimension information stored respectively in the fuse circuits FEX and FEY, and the faulty address stored in the fuse circuits F(0) to F(n−1) can be replaced with either the faulty row address or the faulty column address. Thus, the replacement control circuit 8A can store the any one of the faulty row address and the faulty column address, and it is thereby possible to respond to both the faults of the row and column by a set of replacement control circuits. Further, since a set of replacement control circuits can be shared as a memory unit of the faulty row address and a memory unit of the faulty column address, the number of the replacement control circuits are reduced.

In the first Embodiment described above, the fuse circuits FEX and FEY for storing the row dimension information and the column dimension information, respectively, are provided to constitute the replacement control circuit 8A. However, the structure is not limited to this and, for example, the replacement control circuit 8A may be constituted to encode and store the information for specifying the redundant row 2 or the redundant column 3. By this operation, for example, only 4-bit dimension information is necessary to specify the dimension of a 16-dimensional address space, and increase in the magnitude of the replacement control circuit can be restricted effectively.

Second Embodiment

Next, a second Embodiment of the present invention having, for example, a memory cell array assigned with an address space having n+1-bit row addresses and n-bit column addresses, will be explained.

Figure 5:
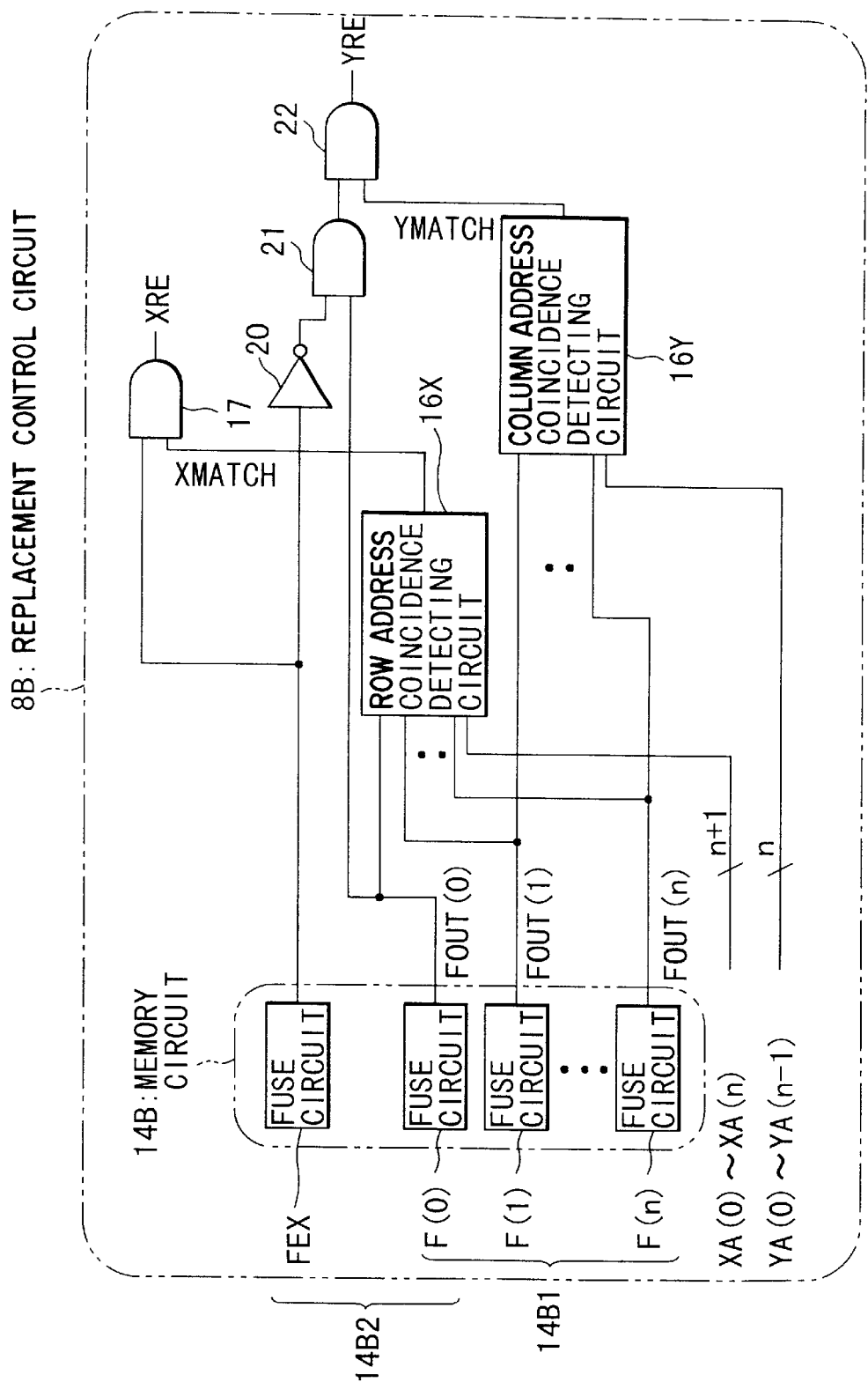
FIG. 5 is a view illustrating an example of a structure of a replacement control circuit which the semiconductor memory device according to a second embodiment of the present invention comprises.

The semiconductor memory device according to the second Embodiment comprises a replacement control circuit 8B shown in FIG. 5 instead of the replacement control circuit 8A of the first Embodiment shown in FIG. 3. The fuse circuit F(0) (i.e. a part of a first memory unit 14B1) is shared as the fuse circuit FEY of FIG. 3 (i.e. a part of a second memory unit 14B2) in accordance with the difference between the number of bits in the faulty row address and that in the faulty column address.

That is, the replacement control circuit 8B comprises a memory circuit 14B including fuse circuits FEX and F(0) to F(n), an inverter 20 for inverting an output signal of the fuse circuit FEX, an AND circuit 21 for operating a logic product between an output signal of the inverter 20 and an output signal of the fuse circuit F(0), and an AND circuit 22 for operating a logic product between an output signal of the AND circuit 21 and the output signal of the column address coincidence detecting circuit 16Y and obtaining the redundant column activation signal YRE, instead of the memory circuit 14A and the AND circuit 18 in the structure of the replacement control circuit 8A in FIG. 3. The inverter 20, and the AND circuits 17, 21 and 22 constitute a gate means for validating a coincidence detection output from either the row address coincidence detecting circuit 16X or the column address coincidence detecting circuit 16Y, in accordance with the dimension information stored in the memory circuit 14B.

Next, the operation of the semiconductor memory device according to the second Embodiment, particularly, the operation of the replacement control circuit 8B will be explained below, with reference to FIG. 1.

First, when the fault is relieved by using the redundant row 2, "1" is stored in the fuse circuit FEX of the replacement control circuit 8B as the row dimension information and the bit data of n+1-bit faulty row address are stored in n+1 number of fuse circuits F(0) to F(n). In this case, logic value "1" is output from the fuse circuit FEX, and the bit data of the faulty address are output from the fuse circuits F(0) to F(n). The AND circuit 17 which receives logic value "1" from the fuse circuit FEX activates the redundant row activation signal XRE on the basis of the row coincidence detection signal XMATCH. As a result, the redundant row decoding circuit 6 of FIG. 1 which receives the redundant row activation signal XRE is activated, and the redundant row 2 is selected when the external row address XA coincides with the faulty address. On the other hand, the AND circuit 21 which receives the reverse signal (logic value "0") of the output signal of the fuse circuit FEX outputs logic value "0", and the AND circuit 22 which receives the logic value "0" fixes the redundant column activation signal YRE in the deactivated state. In this case, therefore, the redundant column 3 is fixed in the non-selected state.

Next, the fault is relieved by using the redundant column 3, logic value "1" is stored in the fuse circuit F(0) as the column dimension information, and the bit data of an n-bit faulty column address are stored in n number of fuse circuits F(1) to F(n−1). The row dimension information of the fuse circuit FEX is "0". In this case, the fuse circuits FEX and F(0) output logic values "0" and "1", respectively.

The AND circuit 17 which receives logic value "0" from the fuse circuit FEX fixes the redundant row activation signal XRE in the deactivated state. Therefore, the redundant row 2 is fixed in the non-selected state. On the other hand, the AND circuit 21 receives the reverse signal (logic value "1") of the output signal of the fuse circuit FEX and the output signal (logic value "1") of the fuse circuit F(0), and supplies logic value "1" to the AND circuit 22. As a result, the redundant column activation signal YRE is activated in accordance with the column coincidence detection signal YMATCH, and the redundant column 3 is selected when the external column address YA coincides with the faulty address.

By the above operations, the replacement control circuit 8B becomes functionally equivalent to the replacement control circuit 8A shown in FIG. 3. According to the second Embodiment, however, as the fuse circuit F(0) which originally stores one bit of the faulty address serves as the fuse circuit FEY shown in FIG. 3, the number of the fuse circuits can be reduced.

In the above explanations, the number of bits (n+1) in the row address is larger than the number of bits (n) in the column address. In an opposite case, the fuse circuit FEX may serve as the fuse circuit FEY for storing the column dimension information, the fuse circuit F(0) may serve as the fuse circuit FEX, and the redundant row activation signal XRE may be replaced with the redundant column activation signal YRE, in the structure shown in FIG. 5.

Third Embodiment

Figure 6:
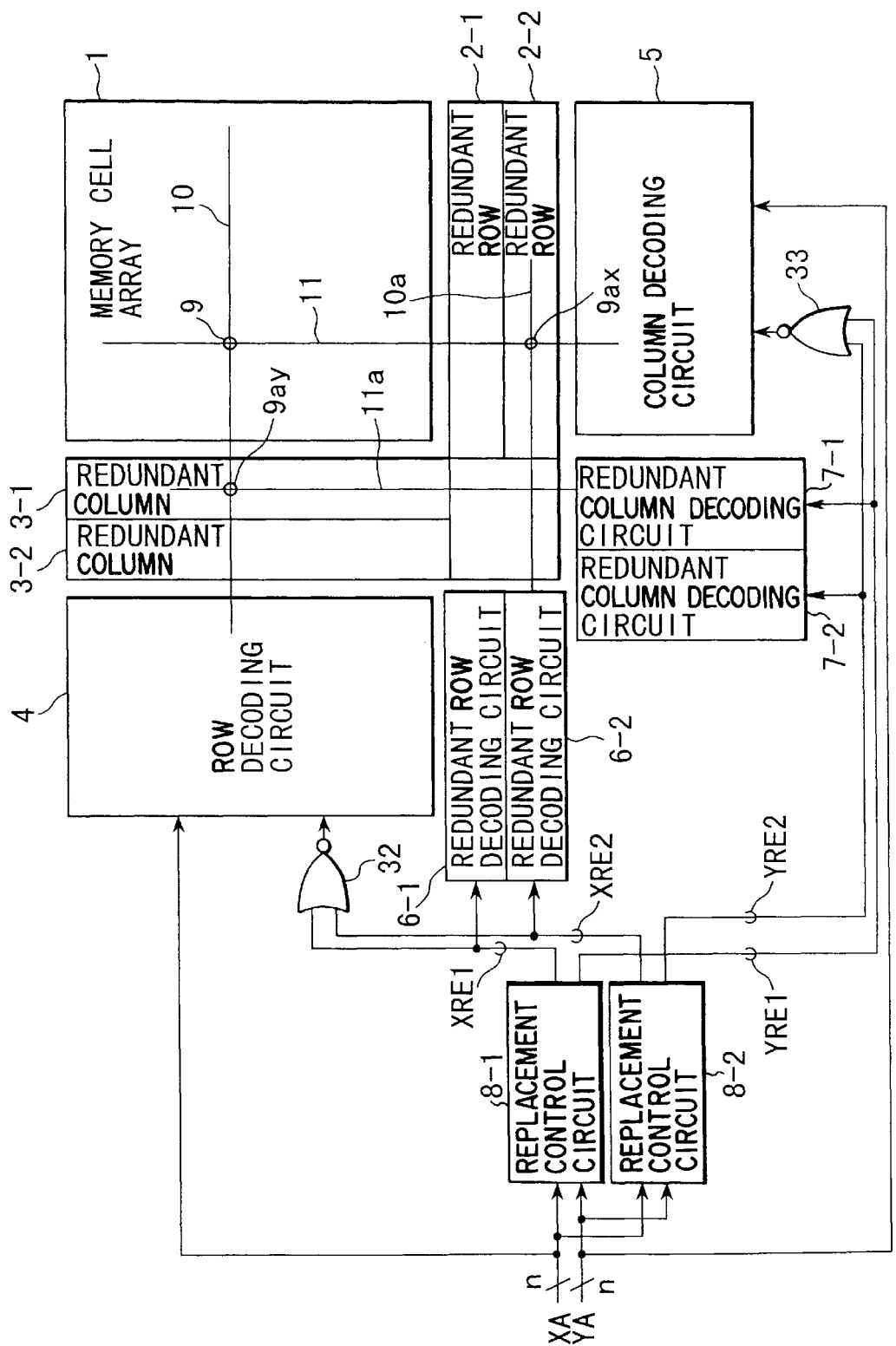
FIG. 6 is a block diagram illustrating a schematic structure of a semiconductor memory device according to a third embodiment of the present invention.

FIG. 6 illustrates a structure of a semiconductor memory device according to a third Embodiment of the present invention. The semiconductor memory device according to the first Embodiment comprises a single replacement control circuit 8A for the redundant row 2 and the redundant column 3. In the third Embodiment, a plurality of redundant rows and redundant columns are provided and a replacement control circuit is assigned to a pair of a redundant row and a redundant column. Further, the third Embodiment comprises an NOR circuit 32 for deactivating the row decoding circuit 4 when the redundant row activation signal XRE1 or XRE2 is activated, and an NOR circuit 33 for deactivating the column decoding circuit 5 when redundant column activation signal YRE1 or TE2 is activated, as the elements corresponding to the inverters 31 and 32 illustrated in FIG. 1.

In other words, as shown in FIG. 6, the memory cell array 1 comprises redundant rows 2-1 and 2-2, and redundant columns 3-1 and 3-2. Redundant row decoding circuits 6-1 and 6-2, and redundant column decoding circuits 7-1 and 7-2 are provided respectively for the redundant rows and the redundant columns. A replacement control circuit 8-1 is provided for the redundant row decoding circuit 6-1 and the redundant column decoding circuit 7-1, and a replacement control circuit 8-2 is provided for the redundant row decoding circuit 6-2 and the redundant column decoding circuit 7-2. The replacement control circuits 8-1 and 8-2 have the same structure as the replacement control circuit 8A shown in FIG. 3 or the replacement control circuit 8B in FIG. 5.

Next, operations of the semiconductor memory device according to the third Embodiment of the present invention, in a case of using the redundant row 2-1 and the redundant column 3-2, will be explained.

The replacement control circuits 8-1 and 8-2 store in advance the desired information such as the faulty row address, faulty column address, row dimension information and column dimension information. When the row address XA from the outside coincides with the faulty row address, the replacement control circuit 8-1 activates the redundant row activation signal XRE1 to activate the redundant row decoding circuit 6-1. When the redundant row decoding circuit 6-1 is activated, the redundant row 2-1 is selected. At this time, the NOR circuit 32 which receives the activated redundant row activation signal XRE1 outputs logic value "0" to deactivate the row decoding circuit 4. As a result, the row (faulty cell) of the memory cell array 1 selected by the faulty address is replaced with the redundant row 2-1.

On the other hand, when the column address YA from the outside coincides with the faulty column address, the replacement control circuit 8-2 activates the redundant column activation signal YRE2 to activate the redundant column decoding circuit 7-2. When the redundant column decoding circuit 7-2 is activated, the redundant column 3-2 is selected. At this time, the NOR circuit 33 which receives the activated redundant column activation signal YRE2 outputs logic value "0" to deactivate the column decoding circuit 5. As a result, the column (faulty cell) of the memory cell array 1 selected by the faulty address is replaced with the redundant column 3-2.

In the above explanation, fault is replaced by using the redundant row 2-1 and the redundant column 3-2. According to the third Embodiment, however, as two replacement control circuits 8-1 and 8-2 are provided, the following eight kinds of replacement can be executed.
(1) Replacement using only redundant row 2-1.
(2) Replacement using only redundant row 2-2.
(3) Replacement using only redundant column 3-1.
(4) Replacement using only redundant column 3-2.
(5) Replacement using redundant rows 2-1 and 2-2.
(6) Replacement using redundant row 2-1 and redundant column 3-2.
(7) Replacement using redundant column 3-1 and redundant row 2-2.
(8) Replacement using redundant columns 3-1 and 3-2.

Therefore, according to the third Embodiment, as a plurality of replacement control circuits are provided, it is possible to respond simultaneously to plural kinds of faulty modes such as the word line fault and the bit line fault, and the rate of relief of the fault can be improved.

In each of the above described embodiments, a two-dimensional address space is assigned to the memory cell array 1. However, an address space of the third or higher dimension may be assigned, and the dimension of the faulty address stored in the replacement control circuit may be defined in accordance with the number of dimensions of the address space.

As described above, according to the present invention, as the faulty address of a certain dimension in the address space assigned to the memory cell array, and the information representing the dimension in the address space of the faulty address are stored, faulty addresses of different dimensions can be stored in a single replacement control circuit. Therefore, it is possible to respond to flexibly respond to the fault of each dimension and also improve the flexibility of the redundancy.

The present invention is effective in particular when applied to an embedded memory macro in which the structure of the rows and/or columns can be modified.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
   a memory cell array in which memory cells are aligned in a matrix and to which a two-dimensional address space is assigned;
   a redundant row for relieving a faulty cell existing in the memory cell array;
   a redundant column for relieving the faulty cell existing in said memory cell array;
   a row decoding circuit for decoding an external address and selecting a row of said memory cell array;
   a column decoding circuit for decoding said external address and selecting a column of said memory cell array;
   a redundant row decoder circuit;
   a redundant column decoder circuit; and
   a replacement control circuit for storing a faulty address of one of the row and the column of said memory cell array and an address space information of the stored faulty address to specify whether the faulty address is the row address or column address, and detecting coincidence between said faulty address and said external address to output a replacement control signal indicative of replacing said faulty cell with said one of redundant row and said redundant column on the basis of the address space information, wherein
   said replacement control circuit comprises a first memory unit for storing one of a row address and a column address as said faulty address, and a second memory unit for storing said address space information to identify said faulty address stored in said first memory unit as the row address or the column address; and
   part of said first memory unit serves as part of said second memory unit in accordance with difference in bit number between said row address and said column address stored as said faulty address.

2. A semiconductor memory device according to claim 1, wherein when said row of said memory cell array is faulty, said replacement control circuit outputs said replacement control signal to said redundant row decoder circuit, and said redundant row decoder circuit selects said redundant row in accordance with said replacement control signal.

3. A semiconductor memory device according to claim 2, wherein, when said redundant row is selected by said redundant row decoder circuit, said row decoding circuit receives an inverted signal of said replacement control signal and is disabled.

4. A semiconductor memory device according to claim 1, wherein when said column of said memory cell array is faulty, said replacement control circuit outputs said replacement control signal to said redundant column decoder circuit selects said redundant column in accordance with said replacement control signal.

5. A semiconductor memory device according to claim 4, wherein, when said redundant column is selected by said redundant column decoder circuit, said column decoding circuit receives an inverted signal of said replacement control signal and is disabled.

6. A semiconductor memory device according to claim 1, wherein said replacement control circuit further comprises:

a row address coincidence detecting circuit for detecting coincidence between a row address of said external address and the faulty address stored in said first memory unit;

a column address coincidence detecting circuit for detecting coincidence between a column address of said external address and the faulty address stored in said first memory unit; and a gate circuit for validating results of detection of one of said row address coincidence detecting circuit and said column address coincidence detecting circuit on the basis of said information stored in said second memory unit.

7. A semiconductor memory device according to claim 6, wherein part of said first memory unit serves as part of said second memory unit in accordance with difference in bit number between said row address and said column address stored as said faulty address.

8. A semiconductor memory device according to claim 7, wherein each of said data storing circuit elements comprises a resistor and a fuse connected in series between a high potential and a low potential.

9. A semiconductor memory device comprising:

a memory cell array in which memory cells are aligned in a matrix and to which a two-dimensional address space is assigned;

a plurality of redundant rows for relieving a faulty cell existing in said memory cell array;

a plurality of redundant columns for relieving the faulty cell existing in said memory cell array;

a row decoding circuit for decoding an external address and selecting a row of said memory cell array;

a column decoding circuit for decoding said external address and selecting a column of said memory cell array; and a plurality of redundant row decoder circuits;

a plurality of redundant column decoder circuits; and a plurality of replacement control circuits each for storing a faulty address of one of a corresponding row and a corresponding column of said memory cell array and an address space information of the stored faulty address to specify whether the faulty address is the row address or column address, and detecting coincidence between said faulty address and said external address to output a replacement control signal indicative of replacing said faulty cell with said one of said corresponding redundant row and said corresponding redundant column on the basis of the address space information, wherein each of said replacement control circuits comprises a first memory unit for storing a row address or a column address as said faulty address, and a second memory unit for storing said address space information to identify said faulty address stored in said first memory unit as the row address or the column address; and part of said first memory unit serves as part of said second memory unit in accordance with difference in bit number between said row address and said column address stored as said faulty address.

10. A semiconductor memory device according to claim 9, wherein, when said row of said memory cell array is faulty, said each replacement control circuit outputs said replacement control signal to a corresponding redundant row decoder circuit, and said corresponding redundant row decoder circuit selects said corresponding redundant row in accordance with said replacement control signal.

11. A semiconductor memory device according to claim 10, wherein, when said corresponding redundant row is selected by said corresponding redundant row decoder circuit, a corresponding row decoding circuit receives an inverted signal of said replacement control signal and is disabled.

12. A semiconductor memory device according to claim 9, wherein, when said column of said memory cell array is faulty, said each replacement control circuit outputs said replacement control signal to a corresponding redundant column decoder circuit, and said corresponding redundant column decoder circuit selects said corresponding redundant column in accordance with said replacement control signal.

13. A semiconductor memory device according to claim 12, wherein, when said corresponding redundant column is selected by said corresponding redundant column decoder circuit, a corresponding column decoding circuit receives an inverted signal of said replacement control signal and is disabled.

14. A semiconductor memory device according to claim 9, wherein each of said replacement control circuits further comprises:

a row address coincidence detecting circuit for detecting coincidence between a row address of said external address and the faulty address stored in said first memory unit;

a column address coincidence detecting circuit for detecting coincidence between a column address of said external address and the faulty address stored in said first memory unit; and a gate circuit for validating results of detection of one of said row address coincidence detecting circuit and said column address coincidence detecting circuit on the basis of said information stored in said second memory unit.

15. A semiconductor memory device according to claim 9, wherein part of said first memory unit serves as part of said second memory unit in accordance with difference in bit number between said row address and said column address stored as said faulty address.

16. A semiconductor memory device according to claim 14, wherein each of said first memory unit and said second memory unit comprises a plurality of data storing circuit elements.

17. A semiconductor memory device according to claim 16, wherein each of said data storing circuit elements comprises a resistor and a fuse connected in series between a high potential and a low potential.

18. A semiconductor memory device having a redundant space in an X-dimension space and a redundant space in a Y-dimension space, in which the X-dimension space has more address bits than the Y-dimension space, the memory device comprising:

a plurality of first nonvolatile elements for address bits for indicating a faulty address of the X-dimension space, one or more of those for one or more bits of the first nonvolatile elements serving as a nonvolatile element or elements for indicating whether data of the faulty address of the Y-dimension space stored in those of the first nonvolatile elements except for said one or more first nonvolatile element or elements is effective or ineffective;

a second nonvolatile element of one bit indicating whether data of the faulty address of the X-dimension space is effective or ineffective; and a control circuit for making effective in the Y-dimension space, data of the faulty address stored in those of the first nonvolatile elements except said one or more first nonvolatile element or elements, when data stored in said one or more first nonvolatile element or elements indicates that data of the faulty address of the Y-dimension space is effective and data stored in the second nonvolatile element indicates that data of the faulty address of the X-dimension space is ineffective.

* * * * *

UNITED STATES PATENT AND TRADEMARK OFFICE
CERTIFICATE OF CORRECTION

PATENT NO. : 6,259,636 B1
DATED : July 10, 2001
INVENTOR(S) : Ryo Fukuda et al.

It is certified that error appears in the above-identified patent and that said Letters Patent is hereby corrected as shown below:

Column 17,
Line 17, "A semiconductor memory device according to claim 6, wherein part of said first memory unit serves as part of said second memory unit in accordance with difference in bit number between said row address and said column address stored as said faulty address." has been replaced with -- A semiconductor memory device according to claim 6, wherein each of said first memory unit and said second memory unit comprises a plurality of data storing circuit elements. --.

Signed and Sealed this

Thirtieth Day of July, 2002

*Attest:*

JAMES E. ROGAN
*Attesting Officer*    *Director of the United States Patent and Trademark Office*